(12) United States Patent
Liou et al.

(10) Patent No.: US 9,305,884 B1
(45) Date of Patent: Apr. 5, 2016

(54) OVERLAY MARK AND METHOD FOR FORMING THE SAME

(71) Applicant: United Microelectronics Corp., Hsinchu (TW)

(72) Inventors: En-Chiuan Liou, Tainan County (TW); Teng-Chin Kuo, Taipei (TW); Yi-Ting Chen, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 14/498,217

(22) Filed: Sep. 26, 2014

(51) Int. Cl.
*H01L 23/544* (2006.01)
*H01L 23/532* (2006.01)
*H01L 21/027* (2006.01)
*H01L 21/311* (2006.01)
*H01L 21/033* (2006.01)
*H01L 21/66* (2006.01)

(52) U.S. Cl.
CPC .......... *H01L 23/544* (2013.01); *H01L 21/0274* (2013.01); *H01L 21/0332* (2013.01); *H01L 21/31144* (2013.01); *H01L 22/20* (2013.01); *H01L 23/53271* (2013.01); *H01L 2223/54426* (2013.01)

(58) Field of Classification Search
None
See application file for complete search history.

(56) References Cited

U.S. PATENT DOCUMENTS

| | | | |
|---|---|---|---|
| 7,190,824 B2 | 3/2007 | Chen | |
| 7,916,276 B2 | 3/2011 | Van Der Schaar et al. | |
| 2009/0246709 A1 | 10/2009 | Nakasugi et al. | |
| 2014/0036243 A1* | 2/2014 | Beyer | G03F 1/72 355/52 |

\* cited by examiner

*Primary Examiner* — Tony Tran
(74) *Attorney, Agent, or Firm* — J.C. Patents

(57) ABSTRACT

An overlay mark applied to a LELE-type double patterning lithography (DPL) process including a first lithography step, a first etching step, a second lithography step and a second etching step in sequence is described. The overlay mark includes a first x-directional pattern and a first y-directional pattern of a previous layer, second x-directional and y-directional patterns of a current layer defined by the first lithography step, and third x-directional and y-directional patterns of the current layer defined by the second lithography step. The second x-directional patterns and the third x-directional patterns are arranged alternately beside the first x-directional pattern. The second y-directional patterns and the third y-directional patterns are arranged alternately beside the first y-directional pattern.

5 Claims, 1 Drawing Sheet

OVERLAY MARK AND METHOD FOR FORMING THE SAME

BACKGROUND OF THE INVENTION

1. Field of Invention

This invention relates to an integrated circuit (IC) process, and particularly to an overlay mark applied in a lithography-etching-lithography-etching (LELE)-type double patterning lithography (DPL) process, and a method for forming the overlay mark.

2. Description of Related Art

In order to check the alignment accuracy between patterns of a previous wafer layer and patterns of a current wafer layer that is more important as the linewidth gets smaller, an IC wafer is usually formed with many overlay marks thereon.

Meanwhile, as the linewidth gets smaller, various double patterning processes are utilized to form dense patterns with a pitch smaller than the lithographic resolution. For example, the current layer may be patterned through a process including a first lithography step, a first etching step, a second lithography step and a second etching step in sequence, namely a LELE-type DPL process.

In such a process, conventionally, linear patterns defined by the first lithography step and linear patterns defined by the second lithography step are formed in two separate overlay mark regions respectively with different parts of linear patterns of the previous layer. Therefore, a larger wafer area is required for forming overlay marks.

Moreover, because the overlay errors of the two lithography steps are measured with respect to different parts of linear patterns of the previous layer in different overlay marks, the accuracy of the overlay errors measurement is lower.

SUMMARY OF THE INVENTION

In view of the foregoing, this invention provides an overlay mark for a LELE-type double patterning lithography (DPL) process.

This invention also provides a method for forming the overlay mark of this invention.

The overlay mark of this invention, which is applied to a LELE-type DPL process including a first lithography step, a first etching step, a second lithography step and a second etching step in sequence, includes a first x-directional pattern and a first y-directional pattern of a previous layer, a plurality of second x-directional patterns and a plurality of second y-directional patterns of a current layer defined by the first lithography step, and a plurality of third x-directional patterns and a plurality of third y-directional patterns of the current layer defined by the second lithography step. The second x-directional patterns and the third x-directional patterns are arranged alternately, beside the first x-directional pattern. The second y-directional patterns and the third y-directional patterns are arranged alternately, beside the first y-directional pattern.

The method for forming the overlay mark of this invention is described below. A first x-directional pattern and a first y-directional pattern of the previous layer are formed. A plurality of second x-directional patterns and a plurality of second y-directional patterns of the current layer are formed in a first photoresist layer in the first lithography step. First overlay errors between the second x-directional patterns and the first x-directional pattern and between the second y-directional patterns and the first y-directional pattern are measured, and the first photoresist layer is retained if the first overlay errors are acceptable. The second x-directional patterns and the second y-directional patterns are transferred to a hard mask layer over the previous layer in the first etching step. A plurality of third x-directional patterns and a plurality of third y-directional patterns of the current layer are formed in a second photoresist layer in the second lithography step. Second overlay errors between the third x-directional patterns and the first x-directional pattern and between the third y-directional patterns and the first y-directional pattern are measured, and the second photoresist layer is retained if the second overlay errors are acceptable. The second x-directional patterns and the third x-directional patterns are arranged alternately beside the first x-directional pattern. The second y-directional patterns and the third y-directional patterns are arranged alternately beside the first y-directional pattern.

In the above overlay mark or method of this invention, it is possible that among a first group including the first x-directional pattern and the first y-directional pattern, a second group including the second x-directional patterns and the second y-directional patterns, and a third group including the third x-directional patterns and the third y-directional patterns, each group independently has a trench form or a solid line form for each pattern in the group. It is also possible that each group independently has a linear shape or a non-linear shape for each pattern in the group.

Since the x-directional and y-directional patterns defined by the first lithography step and those defined by the second lithography step are formed in the same overlay mark, the wafer area required for forming overlay marks can be reduced. Moreover, since the overlay errors of the two lithography steps are measured with respect to the same patterns of the previous layer, the accuracy of the overlay errors measurement is improved.

In order to make the aforementioned and other objects, features and advantages of the present invention comprehensible, a preferred embodiment accompanied with figures is described in detail below.

BRIEF DESCRIPTION OF THE DRAWINGS

FIGS. 1A to 3A, 1B to 3B and 1C schematically illustrate a method for forming an overlay mark for a LELE-type DPL process according to a first embodiment of this invention, wherein FIGS. 1A to 3A are cross-sectional views, FIGS. 1B to 3B are top views of linear patterns of the current layer with line B-B' corresponding to the cross-sectional views, and FIG. 1C is a top view of a linear pattern of the previous layer in the overlay mark with line C-C' corresponding to the cross-sectional views.

FIGS. 4A and 4B schematically illustrate the last step in a method for forming an overlay mark according to a second embodiment of this invention, wherein FIG. 4A is a cross-sectional view, and FIG. 4B is a top view of linear patterns of the current layer with line B-B' corresponding to the cross-sectional view of FIG. 4A.

DESCRIPTION OF EMBODIMENTS

This invention will be further explained with the following embodiments and the accompanying drawings, which are not intended to restrict the scope of this invention.

For example, though the x-directional and y-directional patterns of the previous layer are in a solid line form and those of the current layer defined by the first lithography step are in a trench form in the following embodiments, it is possible that at least one group of the two groups of patterns is in a different form in other embodiments.

Moreover, though each group of patterns has a linear shape for each pattern in the group in the following embodiments, each group may alternatively independently have a non-linear shape for each pattern in the group in other embodiments. The non-linear shape may be a square shape, a rectangular shape, or an annular shape, etc.

Furthermore, for the cases that each group of patterns has a linear shape for each pattern in the group, although the linear patterns of the previous layer are much wider that the linear patterns of the current layer in the overlay mark in the illustrated embodiments, their width may be reduced to be comparable to that of the linear patterns of the current layer.

In addition, for the cases that each group of patterns has a linear shape for each pattern in the group, although there are a specific number of sets of alternately arranged linear patterns defined by the first lithography step and linear patterns defined by the second lithography step arranged in a particular manner in the third embodiment of this invention, there may alternatively be a different number of such sets of linear patterns arranged in a different manner.

Figure 1C:
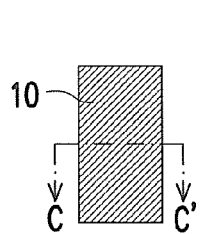

FIGS. 1A to 3A, 1B to 3B and 1C schematically illustrate a method for forming an overlay mark for a LELE-type DPL process according to the first embodiment of this invention, wherein FIGS. 1A to 3A are cross-sectional views, FIGS. 1B to 3B are top views of linear patterns of the current layer with line B-B' corresponding to the cross-sectional views, and FIG. 1C is a top view of a linear pattern of the previous layer in the overlay mark with line C-C' corresponding to the cross-sectional views.

It is particularly noted that only one linear pattern of the previous layer is illustrated in the figures and described below for both of the x-directional linear pattern and the y-directional linear pattern of the previous layer, since both of them have the same basic shape. Similarly, only one set of parallel linear patterns of the current layer is illustrated in the figures and described below for both of the x-directional linear patterns and the y-directional linear patterns of the current layer defined by the first and second lithography steps, since both of them have the same basic shape. Moreover, the device area is not illustrated in the figures, just for simplicity.

Figure 1A:
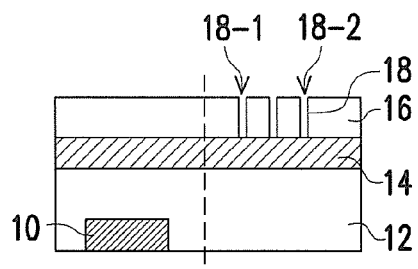
Figure 1B:
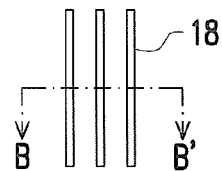

Referring to FIGS. 1A, 1B and 1C, a linear pattern 10 of the previous layer is formed in the overlay mark region, simultaneously with the formation of the patterns of the previous layer in the device area (not shown). The previous layer may include a conductive layer to be electrically connected with. The conductive layer may include doped polysilicon.

An insulating layer 12, which acts as a current layer to be formed with openings therein for electrical connection of the previous layer, is then formed covering the previous layer including the linear pattern 10 (the first x-directional pattern and the first y-directional pattern) in the overlay mark region. The DPL process to which the overlay mark is applied may be a process for forming dense contact openings in the insulating layer 12. The insulating layer 12 may include silicon oxide or a low-k dielectric layer. A hard mask layer 14 is then formed over the insulating layer 12, possibly including an advanced patterning film (APF), silicon nitride (SiN), or titanium nitride (TiN).

Thereafter, in the first lithography step of the DPL process, a first photoresist layer 16 is formed in the overlay mark region and the device area (not shown), and then a plurality of parallel trench patterns 18 (the second x-directional patterns and the second y-directional patterns) of the current layer are formed in the first photoresist layer 16, simultaneously with the formation of a first part of the patterns of the current layer in the device area (not shown). The overlay error between the trench patterns 18 of the current layer and the linear pattern 10 of the previous layer is measured, and the first photoresist layer 16 is retained if the measured overlay error is acceptable. In measuring the overlay error, it is possible to measure the positions of the two outmost patterns 18-1 and 18-2 of the trench patterns 18 and use the average value of them.

Figure 2A:
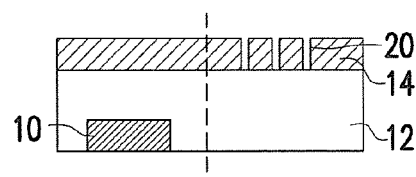
Figure 2B:
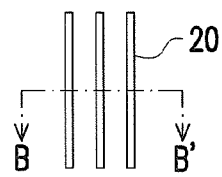

Referring to FIGS. 2A and 2B, the trench patterns 18 are transferred to the hard mask layer 14 to form trench patterns 20 (the second x-directional patterns and the second y-directional patterns) of the current layer in the first etching step of the DPL process, simultaneously with the transfer of the first part of the patterns of the current layer to the hard mask layer 14 in the device area (not shown). In the first etching step, the etching may be continued into the insulating layer 12 under the hard mask layer 14, in both the overlay mark region and the device area (not shown).

Figure 3A:
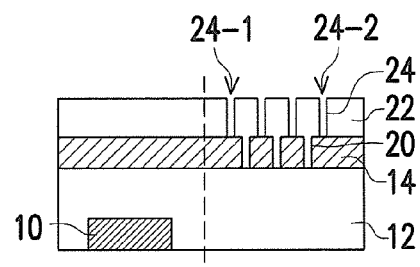
Figure 3B:
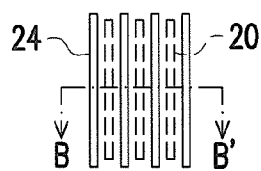

Referring to FIGS. 3A and 3B, in the subsequent second lithography step of the DPL process, a second photoresist layer 22 is formed in the overlay mark region and the device area (not shown), and then a plurality of parallel trench patterns 24 (the third x-directional patterns and the third y-directional patterns) of the current layer are formed in the second photoresist layer 22, simultaneously with the formation of a second part of the patterns of the current layer in the device area (not shown). The trench patterns 24 defined by the second lithography step and the trench patterns 20 defined by the first lithography step are arranged alternately and parallel with each other. Then, the overlay error between the trench patterns 24 of the current layer and the linear pattern 10 of the previous layer is measured, and the second photoresist layer 22 is retained if the measured overlay error is acceptable. In measuring the overlay error, it is possible to measure the positions of the two outmost patterns 24-1 and 24-2 of the trench patterns 24 and use the average value of them.

Figure 4A:
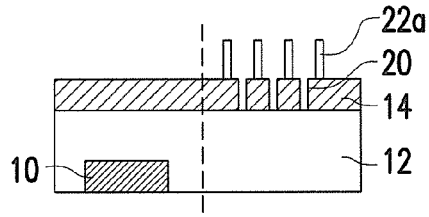
Figure 4B:
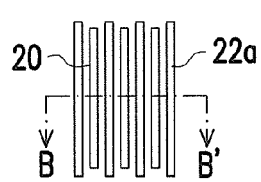

Though the linear patterns of the current layer defined by the second lithography step are trenches (24) in the second photoresist layer (22), they may alternatively be solid line patterns form from the second photoresist layer, as described in the second embodiment of this invention and schematically illustrated in FIGS. 4A and 4B, wherein FIG. 4A and FIG. 4B are a cross-sectional view and a top view, respectively.

Referring to FIGS. 4A and 4B, in the second lithography step of the DPL process in the second embodiment of this invention, a second photoresist layer is formed in the overlay mark region and the device area (not shown), and then a plurality of parallel solid line patterns 22a (the third x-directional patterns and the third y-directional patterns) of the current layer are formed from the second photoresist layer, simultaneously with the formation of a second part of the patterns of the current layer in the device area (not shown). The solid line patterns 22a defined by the second lithography step and the trench patterns 20 defined by the first lithography step are arranged alternately and parallel with each other. Then, the overlay error between the line patterns 22a of the current layer and the linear pattern 10 of the previous layer is measured, and the second photoresist layer is retained if the overlay error is acceptable.

The overlay mark of this invention may include more than one x-directional linear patterns and more than one y-directional linear patterns of the previous layer, more than one aforementioned sets of x-directional linear patterns of the current layer defined by the first and second lithography steps, and more than one aforementioned sets of y-directional linear patterns of the current layer defined by the first and second lithography steps. One such example is described below.

Figure 5:
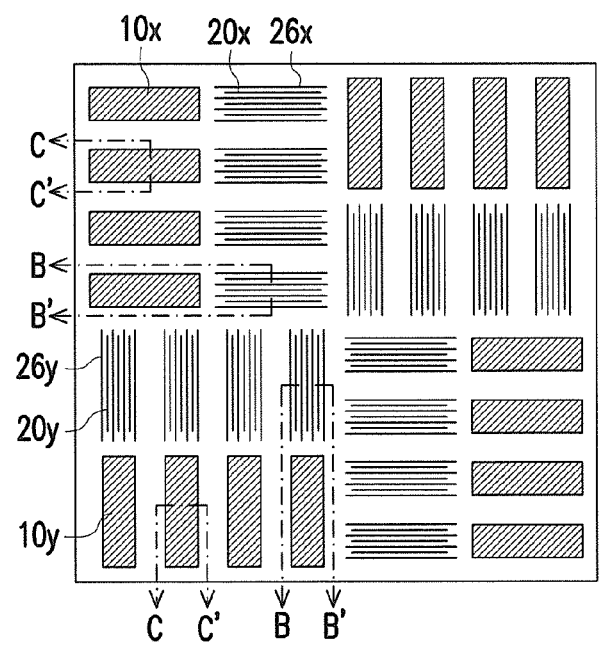
FIG. 5 schematically illustrates, in a top view, an overlay mark for a LELE-type DPL process according to a third embodiment of this invention, which is based on the basic structure as shown in FIG. 3A/B or FIG. 4A/B and FIG. 1C.

FIG. 5 schematically illustrates, in a top view, an overlay mark for a LELE-type DPL process according to the third embodiment of this invention, which is based on the basic structure as shown in FIG. 3A/B or FIG. 4A/B and FIG. 1C.

Referring to FIG. 5, the overlay mark has two regions for all the x-directional linear patterns 10x, 20x and 26x of the previous layer and the current layer, and two regions for all the y-directional linear patterns 10y, 20y and 26y of the previous layer and the current layer. The former two regions are arranged diagonally, so are the latter two regions. The linear patterns 10x and 10y of the previous layer corresponds to the aforementioned linear pattern 10 (FIGS. 1-4) of the previous layer. The linear patterns 20x and 20y of the current layer are trench patterns corresponding to the aforementioned trench patterns 20 (FIGS. 2-4) of the current layer defined by the first lithography step. The linear patterns 26x and 26y of the current layer correspond to the aforementioned trench patterns 24 (FIG. 3) or solid line patterns 22a (FIG. 4) of the current layer defined by the second lithography step.

In any one of the two regions of x-directional patterns, the x-directional linear patterns 10x are arranged in parallel, and plural sets of x-directional linear patterns 20x and 26x of the current layer defined by the first and the second lithography steps are arranged in parallel beside the x-directional linear patterns 10x. In each of these sets, the x-directional trench patterns 20x of the current layer defined by the first lithography step and the x-directional linear patterns 26x of the current layer defined by the second lithography step are arranged alternately beside one of the x-directional linear patterns 10x.

Similarly, in any one of the two regions of y-directional patterns, the y-directional linear patterns 10y are arranged in parallel, and a plurality of sets of y-directional linear patterns 20y and 26y of the current layer defined by the first and second lithography steps are arranged in parallel beside the y-directional linear patterns 10y. In each of these set, the y-directional trench patterns 20y of the current layer defined by the first lithography step and the y-directional linear patterns 26y of the current layer defined by the second lithography steps are arranged alternately beside one of the y-directional linear patterns 10y.

Since the linear patterns defined by the first lithography step and those defined by the second lithography step are formed in the same overlay mark as exemplified in the above embodiments, the wafer area required for forming overlay marks can be reduced.

Moreover, since the overlay errors of the two lithography steps are measured with respect to the same linear patterns of the previous layer as exemplified in the above embodiments, the accuracy of the overlay errors measurement is improved.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for forming an overlay mark applied to a double patterning lithography (DPL) process including a first lithography step, a first etching step, a second lithography step and a second etching step in sequence, comprising:

forming a first x-directional pattern and a first y-directional pattern of a previous layer;
    defining, in the first lithography step, a plurality of second x-directional patterns and a plurality of second y-directional patterns of a current layer in a first photoresist layer;
    measuring first overlay errors between the second x-directional patterns and the first x-directional pattern and between the second y-directional patterns and the first y-directional pattern, and retaining the first photoresist layer if the first overlay errors are acceptable;
    transferring, in the first etching step, the second x-directional patterns and the second y-directional patterns to a hard mask layer over the previous layer;
    defining, in the second lithography step, a plurality of third x-directional patterns and a plurality of third y-directional patterns of the current layer in a second photoresist layer; and
    measuring second overlay errors between the third x-directional patterns and the first x-directional pattern and between the third y-directional patterns and the first y-directional pattern, and retaining the second photoresist layer if the second overlay errors are acceptable,
    wherein the second x-directional patterns and the third x-directional patterns are arranged alternately beside the first x-directional pattern, and the second y-directional patterns and the third y-directional patterns are arranged alternately beside the first y-directional pattern;
    wherein among a first group including the first x-directional pattern and the first v-directional pattern, a second group including the second x-directional patterns and the second y-directional patterns, and a third group including the third x-directional patterns and the third y-directional patterns, each group independently has a trench form or a solid line form for each pattern in the group;
    wherein the previous layer comprises a conductive layer to be electrically connected with, and the current layer comprises an insulating layer that covers the conductive layer and is under the hard mask layer;
    wherein the conductive layer comprises doped polysilicon; and
    wherein in transferring the second x-directional patterns and the second y-directional patterns to the hard mask layer in the first etching step, the etching is continued into the insulating layer under the hard mask layer.

2. The method of claim 1, wherein the DPL process is for forming dense contact openings in the insulating layer.

3. The method of claim 1, wherein the third x-directional patterns and the third y-directional patterns of the current layer defined in the second lithography step are all trenches patterns in the second photoresist layer.

4. The method of claim 1, wherein in measuring each of the first or second overlay errors, positions of two outmost patterns of the second x- or y-directional patterns or of the third x- or y-directional patterns are measured.

5. The method of claim 1, wherein the hard mask layer comprises an advanced patterning film (APF), silicon nitride (SiN), or titanium nitride (TiN).

* * * * *